United States Patent [19]

Mehrgardt

[11] Patent Number: 4,706,040
[45] Date of Patent: Nov. 10, 1987

[54] FREQUENCY SYNTHESIZER CIRCUIT

[75] Inventor: Soenke Mehrgardt, March, Fed. Rep. of Germany

[73] Assignee: Deutsche ITT Industries GmbH, Freiburg, Fed. Rep. of Germany

[21] Appl. No.: 866,878

[22] Filed: May 23, 1986

[30] Foreign Application Priority Data

May 23, 1985 [EP] European Pat. Off. ........ 85106351.1

[51] Int. Cl.$^4$ ............................................. H03L 7/08
[52] U.S. Cl. .................................... 331/1 A; 331/16; 331/25
[58] Field of Search ...................... 331/1 A, 10, 14, 16, 331/17, 18, 25, 57

[56] References Cited

U.S. PATENT DOCUMENTS

| | | | |
|---|---|---|---|
| 3,555,446 | 1/1971 | Braymer | 331/16 |
| 3,582,810 | 6/1971 | Gillette | 331/16 X |
| 4,052,673 | 10/1977 | Herzog | 455/112 |
| 4,145,667 | 3/1979 | Messerschmitt | 331/16 |
| 4,586,005 | 4/1986 | Crawford | 331/1 A |

Primary Examiner—Eugene R. LaRoche
Assistant Examiner—Robert J. Pascal
Attorney, Agent, or Firm—T. L. Peterson

[57] ABSTRACT

In a frequency synthesizer circuit, a phase-locked loop serves to generate an analog signal. The circuit includes a phase comparator, a reference oscillator, an analog low-pass filter, and a voltage-controlled oscillator (VCO). The output of the VCO is the analog signal. The phase comparator is a digital circuit to which the two phases to be compared are furnished as digital signals. One of the phase signals is a signal representative of the phase of the reference oscillator. The second phase signal is derived from an accumulator which is clocked by the VCO and accumulates an adjustable numerical value on receipt of each clock pulse. The content of the accumulator is fed to the phase comparator as the second phase signal. The phase-locked loop synchronizes the accumulator cycle frequency, which is adjustable via the numerical value, with the reference or VCO frequency and thus determines the frequency of the analog signal.

10 Claims, 3 Drawing Figures

FREQUENCY SYNTHESIZER CIRCUIT

BACKGROUND OF THE INVENTION

This invention pertains to a frequency synthesizer circuit for generating an analog signal of digitally step-adjustable frequency wherein a reference oscillator generating a reference signal, a phase comparator, an analog low-pass filter, and a voltage-controlled oscillator (VCO) are cascaded in this order, and wherein the phase comparator is controlled by the VCO.

Such frequency synthesizer circuits in the form of phase-locked loops are widely used and are described in many references; see, for example, R. Best, "Theorie und Anwendungen des Phase-locked-loops", AT-Verlag Stuttgart, 3rd Edition, 1982, pages 85 to 89, especially FIG. 79b. This frequency synthesizer circuit produces a signal which has a fixed, but digitally adjustable frequency ratio to a reference frequency. This is achieved by means of an adjustable frequency divider connected into the feedback path between the VCO output and the phase comparator.

The main disadvantage of the prior art frequency-synthesizer circuits is that the frequency is difficult to adjust in small steps, particularly if the ratio of the VCO's oscillation frequency to the reference frequency lies between about 0.1 and 10. This difficulty is overcome by the use of divide-by-fraction frequency dividers, but at the expense of phase jitter.

SUMMARY OF THE INVENTION

In a frequency synthesizer circuit in accordance with the invention, the reference frequency is moved as close as possible to the VCO frequency so that the steps of the frequency adjustment are very small in relation to the VCO frequency. The signal frequency is adjustable with crystal accuracy and within a wide frequency range. The frequency synthesizer circuit is well suited for integration and can be used in frequency synthesizer systems of radio sets, television sets, and phono equipment.

In a frequency synthesizer circuit in accordance with the invention, a phase-locked loop serves to generate an analog signal. The circuit includes a phase comparator, a reference oscillator, an analog low-pass filter, and a voltage-controlled oscillator (VCO). The output of the VCO is the analog signal. The phase comparator is a digital circuit to which the two phases to be compared are furnished as digital signals. One of the phase signals is a signal representative of the phase of the reference oscillator. The second phase signal is derived from an accumulator which is clocked by the VCO and accumulates an adjustable numerical value on receipt of each clock pulse. The content of the accumulator is fed to the phase comparator as the second phase signal. The phase-locked loop synchronizes the accumulator cycle frequency, which is adjutable via the numerical value, with the reference or VCO frequency and thus determines the frequency of the analog signal.

BRIEF DESCRIPTION OF THE DRAWING

The invention will now be explained in more detail with reference to the accompanying drawing, in which.

DETAILED DESCRIPTION

Figure 1:
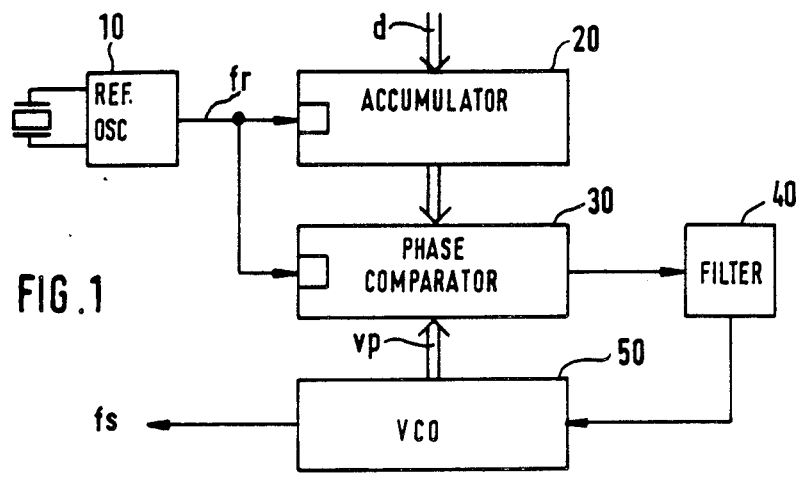
FIG. 1 is a block diagram of a first embodiment of the invention.

In the block diagram of FIG. 1, the crystal-stabilized reference oscillator 10 provides a reference signal fr, to the clock inputs of an accumulator 20 and the phase comparator 30. The data input of the accumulator 20 is presented with the frequency-determining numerical value d. The output signal of the accumulator 20 is fed to the first input of the digital phase comparator 30. The digital, e.g., binary, output signal of phase comparator 30 is fed to the input of analog low-pass filter 40, whose output is coupled to the control input of VCO 50. The data signal vp of VCO 50, which is representative of the phase of the VCO, is applied to the second input of the phase comparator 30. The output signal of the VCO 50 is the continuous signal fs, which is fed to further subcircuits.

Figure 2:
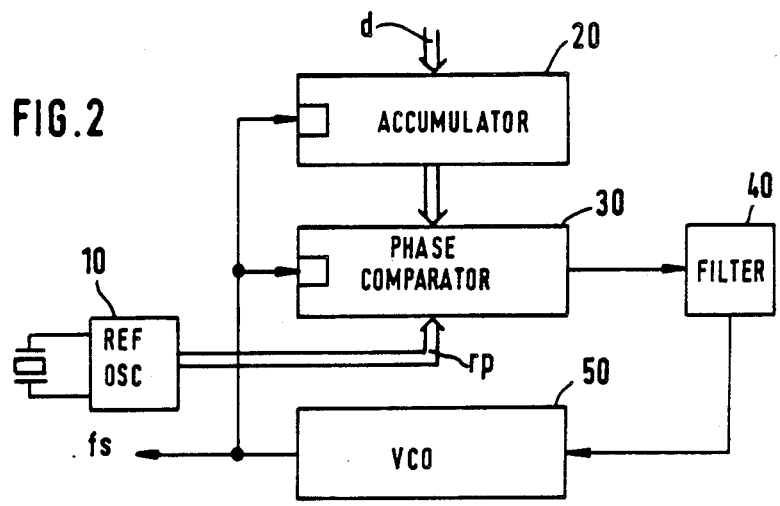
FIG. 2 is a block diagram of a second embodiment of the invention.

In the block diagram of FIG. 2, output signal fs of VCO 50 is fed to further subcircuits and to the clock inputs of the accumulator 20 and the digital phase comparator 30. The data input of the accumulator 20 is presented with the numerical value d, and the output of the accumulator 20 is coupled to the first input of the digital phase comparator 30. The second input of the latter is supplied with the digital signal corresponding to the phase of the crystal-controlled reference oscillator 10, i.e., with the reference phase rp. The digital, e.g., binary, output signal of the digital phase comparator 30 is fed to the analog low-pass filter 40, whose output signal is applied to the control input of the VCO 50.

The object of the invention is attained by supplementing the phase-locked loop with the accumulator 20, which is clocked by the reference signal or the VCO signal and, on the occurrence of each clock pulse, accumulates a numerical value d presented to its data input, i.e., adds this numerical value to the result of the preceding accumulation. The respective accumulator contents serve as a constantly increasing phase of a digital oscillator. This phase is compared in the digital phase comparator 30 with the digitally coded phase of the reference oscillator 10 or the VCO 50. Depending on whether the phase of the digital oscillator leads or lags the phase of the reference oscillator, the phase comparator 30 provides a digital, e.g., binary, control signal which is smoothed with the analog low-pass filter 40 and fed to the analog control input of the VCO 50.

To produce the digitally coded phase of the reference oscillator 10 or the VCO 50, the reference oscillator 10 may contain a variable delay device with time-equidistant taps or a variable delay line whose delay elements are provided with taps. The instantaneous state of these taps represents the instantaneous phase of the reference oscillator 10 or the VCO 50.

The variable delay device may contain, for example, a capacitor whose charge is changed by means of a controllable current. Voltage comparators along the charge-transfer path give the time-equidistant taps. The duration of the charge transfer is synchronized with either the reference period or the VCO period. The need for synchronization is eliminated if the charge-transfer path is also the time-determining quantity of the VCO, as in relaxation oscillators.

The variable delay line may be, for example, a non-clocked cascade arrangement of inverters, inverter groups or other delay-introducing signal transmission stages with voltage taps at the junction points between every two adjacent cascaded elements. By means of the adjustable switching delay of the cascaded elements, the total delay is synchronized with either the reference period or the VCO period. Here, too, the need for synchronization is eliminated if the variable delay line is used as the VCO 50 in the manner of a ring oscillator.

Figure 3:
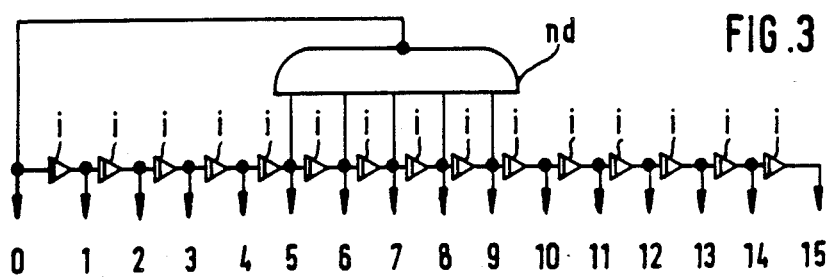
FIG. 3 is a block diagram of a variable delay line connected to form a ring.

A preferred embodiment of a variable delay line connected to form a ring is shown in the block diagram of FIG. 3. The block diagram of FIG. 3 shows a cascade arrangement of 15 noninverting delay elements each formed by a dual inverter i, with the output of one dual inverter connected to the input of the next, and these connections being tapped to form external voltage taps. In addition to these voltage taps, voltage taps are provided at the input of the first of the dual inverter i and the output of the last of the dual inverters i. The voltage taps are numbered from 0 to 15 beginning with the input. The inputs of the five-input NAND gate nd are connected to the taps 5, 6, 7, 8 and 9, respectively, and the output of the NAND gate nd feeds the input of the first dual inverter.

As the five signal taps 5 . . . 9 are connected via the NAND gate nd to the input of the dual-inverter cascade, a circulating stable signal pattern appears at the signal taps 0 to 15 after a few cycles, regardless of the input state. A block of 11 high-level states and a block of 5 low-level states cycles at the signal taps 0 to 15. The cycle time can be controlled by means of the switching delay of the dual inverters i.

The above will now be illustrated by a few numerical examples. If the accumulator 20 is a 24-stage binary counter that is clocked at a rate of $2^{24}$ Hz (about 17 MHz), and if the numerical value at the input is $d=1$, it will be full in one second; the cycle frequency of the accumulator 20 is thus 1 Hz. With the numerical value $d=2$, the cycle frequency increases to 2 Hz, and with the numerical value $d=2^{22}$, it increases to $2^{22}$ Hz=4.199804 Hz. These cycle frequencies are also the frequencies of the signal fs or the reference signal fr, to an accuracy of 1 Hz.

It is not necessary for all 24 bits of the accumulator 20 to be fed to the digital phase comparator 30, particularly if the reference phase rp or the VCO phase, the data signal vp, is taken from only 16 voltage taps. Then, the four most significant bits of the accumulator 20 are sufficient for the phase comparison. The digital uncertainty in the phase comparison is then $\pm 1/32$ referred to one period; this does not affect the signal fs because of the smoothing action of the subsequent low-pass filter.

The cycle frequency of the accumulator 20 and the frequency of the reference oscillator 10 or of the VCO 50, which is to be compared with that cycle frequency, are thus identical. Hence, the two frequencies can be closer together than in conventional frequency synthesizer systems, which is an advantage, for the synchronization of the signal fs is effected in time intervals which are correspondingly close together. The free-running intervals, in which the phases may move away from each other, are only a few periods, i.e., become very short.

Another advantage is that the increments of the signal frequency can be very small compared to the signal frequency itself; in the example described, this is 1 Hz referred to a signal frequency of 16.8 MHz, the dynamic frequency range being at least $\pm 30\%$ of the signal frequency. Since the reference oscillators in frequency synthesizers are generally designed as stable crystal oscillators, the absolute frequency of the signal fs is held constant to a high degree of accuracy.

A further advantage is that, in accordance with the two variants of the invention, either the VCO frequency or the reference frequency may be the lower frequency; both frequencies can be approximated by adding a frequency divider in the output of the VCO or the reference oscillator, depending on the variant of the invention.

A special advantage is that the frequency synthesizer circuit in accordance with the invention is well suited for integration, which permits the circuit to be used in consumer-electronics equipment, e.g., as a clock generator for color-television receivers with digital signal-processing circuitry, where the frequency synthesizer circuit serves to generate a crystal-stabilized clock signal having four times the chrominance-subcarrier frequency and synchronized with the frequency and phase of the received color burst. A single frequency synthesizer circuit is sufficient for multistandard operation at the PAL, NTSC or SECAM chrominance-subcarrier frequency and replaces the hitherto used crystal oscillator circuits, which are subject to pulling, in a particularly advantageous manner.

What is claimed is:

1. A frequency synthesizer circuit for generating an analog signal of digitally step-adjustable frequency, said circuit comprising:
   a reference oscillator generating a reference signal;
   a phase comparator comprising digital circuitry and having first and second inputs, a clock input and an output, said reference oscillator being coupled to said phase comparator second input;
   a digital accumulator having its output connected to said phase comparator first input, having a first input receiving a numerical value, and having a clock input;
   an analog low pass filter;
   a voltage controlled oscillator having an output providing said analog signal, said voltage controlled oscillator output coupled to said digital accumulator clock input and said phase comparator clock input, and having an input coupled to said phase comparator output via said analog low pass filter;
   said numerical value determining the frequency of said analog signal.

2. A circuit in accordance with claim 1, wherein:
   said voltage controlled oscillator comprises a variable delay device with time-equidistant taps connected to said phase comparator second input.

3. A circuit in accordance with claim 1, wherein:
   said voltage controlled oscillator comprises a variable delay line whose delay elements are provided at least in part with signal taps connected to said phase comparator second input.

4. A circuit in accordance with claim 3, wherein:
   said delay line is connected to form a ring.

5. A circuit in accordance with claim 2, wherein:
   said variable delay device forms part of an automatic control system which regulates the total delay at said taps at the period of said analog signal.

6. A circuit in accordance with claim 1, wherein:
   the output of said accumulator comprises a plurality of bits and only a predetermined number of the most significant of said bits are coupled to said phase comparator first input.

7. A circuit in accordance with claim 2, wherein:

the output of said accumulator comprises a plurality of bits and only a predetermined number of the most significant of said bits are coupled to said phase comparator first input.

8. A circuit in accordance with claim 3, wherein:
the output of said accumulator comprises a plurality of bits and only a predetermined number of the most significant of said bits are coupled to said phase comparator first input.

9. A circuit in accordance with claim 7, wherein said taps are connected in parallel to said phase comparator input, the number of said taps being equal to the number of signal states determined by said predetermined number of the most significant of said bits.

10. A circuit in accordance with claim 8, wherein said taps are connected in parallel to said phase comparator input, the number of said taps being equal to the number of signal states determined by said predetermined number of the most significant of said bits.

* * * * *